United States Patent
Chandler et al.

(10) Patent No.: US 6,291,978 B1
(45) Date of Patent: Sep. 18, 2001

(54) SYSTEM AND METHOD FOR DETECTING SHORTS, OPENS AND CONNECTED PINS ON A PRINTED CIRCUIT BOARD USING AUTOMATIC TEST EQUIPMENT

(75) Inventors: Kevin G. Chandler, Loveland; Barry A. Alcorn, Fort Collins; Bryan D. Boswell, Loveland; John M. Heumann, Loveland; Ed O. Schlotzhauer, Loveland, all of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/361,369

(22) Filed: Jul. 26, 1999

Related U.S. Application Data

(62) Division of application No. 08/559,905, filed on Nov. 17, 1995, now Pat. No. 5,597,775, which is a continuation of application No. 08/114,592, filed on Aug. 31, 1993, now Pat. No. 5,504,432.

(51) Int. Cl.$^7$ ................................................... G01R 31/02
(52) U.S. Cl. ................................................ 324/73.1; 324/763
(58) Field of Search .................................. 324/73.1, 754, 324/158.1, 765, 537, 158 R, 501, 763

(56) References Cited

U.S. PATENT DOCUMENTS

| | | |
|---|---|---|
| 4,194,113 | 3/1980 | Fulks et al. .................. 371/20 |
| 4,620,304 | 10/1986 | Faran, Jr. et al. ............. 371/73 |
| 4,714,875 | 12/1987 | Bailey et al. ................. 324/73 |
| 4,841,240 * | 6/1989 | Hsue et al. ................ 324/158 P |
| 4,947,106 | 8/1990 | Chism ...................... 324/73.1 |
| 5,153,521 | 10/1992 | Grondalski ................. 324/537 |
| 5,448,166 | 9/1995 | Parker .................... 324/158.1 |
| 5,504,432 | 4/1996 | Chandler et al. ............ 324/537 |

FOREIGN PATENT DOCUMENTS

| | | | |
|---|---|---|---|
| 268 306 A1 | 5/1989 | (DD) | ................. 31/28 |
| 0552532A2 | 7/1993 | (EP) | ................ 31/318 |
| 2136138A | 9/1984 | (GB) | ................... 31/2 |

\* cited by examiner

*Primary Examiner*—Safet Metjahic
*Assistant Examiner*—E P LeRoux

(57) ABSTRACT

A method for testing node interconnection on a circuit board. The method utilizes an automated test system having at least one test channel, wherein each test channel has a digital driver with a first input and a first output, and a digital receiver with a second output and a second input. The second input of the receiver is coupled to the first output of the driver and to a test probe. The test probe is configured to couple the driver and receiver to one of a plurality of nodes on a circuit board. During a node interconnection test, the driver of a first test channel applies a test signal to a selected node of the plurality of nodes. A predetermined amount of time after application of the test signal, the receiver of the first test channel reads a node voltage of the selected node. The node voltage is then compared to a predetermined threshold voltage of the receiver of the first test channel, and the result of the comparison is an indication as to whether the selected node is coupled to ground.

20 Claims, 11 Drawing Sheets

SYSTEM AND METHOD FOR DETECTING SHORTS, OPENS AND CONNECTED PINS ON A PRINTED CIRCUIT BOARD USING AUTOMATIC TEST EQUIPMENT

Cross Reference to Related Application(s)

This is a divisional of copending application Ser. No. 08/559,905 filed on Nov. 17, 1995 (now U.S. Pat. No. 5,597,775), which was a continuation of then co-pending application Ser. No. 08/114,592 filed on Aug. 31, 1993 (now U.S. Pat. No. 5,504,432).

BACKGROUND OF THE INVENTION

1. Field of the Invention

The present invention relates to the field of circuit board testing. More specifically, the invention relates to a system and method for digitally testing for shorts, opens and connected nodes on printed circuit boards using automatic test equipment.

2. Background Art

Testing complex digital circuitry at the circuit board level is frequently performed on an Automated Test Equipment (ATE) system. The HPFTS40 functional test system, available from Hewlett Packard Company, Palo Alto, Calif., is an example of such an ATE system. The preferred embodiment of the present invention is implemented using the HPFTS40.

Testing performed on an ATE system includes functional test and in-circuit test. Functional test conventionally involves providing input signals to the external inputs of a circuit board or printed wiring board (PWB) under test and observing output signals from the external outputs of the PWB. This type of testing becomes quite complex for large circuits and generally provides limited diagnostics. Both in-circuit testing and functional testing on ATE systems enables nodes on a printed circuit board to be tested for short circuits, open circuits, interconnects or other manufacturing or device defects, by driving selected nodes on the circuit board and observing the response at other nodes. In-circuit testing entails utilizing contact probes which can contact internal nodes on the circuit board. Signals are applied to and received from the board via these probes. Detailed diagnostics are available from in-circuit testing. Functional testing is normally performed from an edge connector on the circuit board.

Both functional and traditional digital in-circuit testing require that power be applied to the board being tested. Applying power, however, can damage components if short circuits are present. Therefore, it is desirable to perform a low power shorts test to detect and correct short circuits and other misconnections prior to subjecting the board to full power.

Interconnect tests can be performed as part of either a functional test or an in-circuit test. Interconnect tests seek to locate problems which are introduced during mounting of the integrated circuit (IC) chips on the PWB. An interconnect test involves testing each conductive "net" or "node" on the PWB to ensure that it connects the proper devices (for example, input and/or output buffers of one or more IC chips). A "net" or "node" is defined as an equipotential surface formed by a physical conductor. The primary problems that are tested for are open-circuits and short-circuits. Open-circuits frequently result from broken pins or "cold" solder joints. Short-circuits may be caused by excess solder bridging the gap from one IC pin connection to the next.

Historically, in-circuit and/or functional testing on an ATE system enables nodes on a printed circuit board to be tested for short circuits by driving the nodes on the circuit board with analog instruments. Analog instruments allow low voltages to be used to drive the circuit board pins, or nodes, and accurate measurements can be made. Typically an analog measurement is less susceptible to noise errors because measurement can be accomplished using a long integration cycle. The problem with analog testing is that signal throughput is slow. Digital testing can significantly improve signal throughput. The cost of utilizing digital signals is that measurements made utilizing long integration cycles are not possible because of the step-like characteristic of digital signals. Therefore errors are more prevalent. Attempts have been made to use digital signals when performing functional testing of circuit boards. However, special equipment has been required to reduce signal errors. Such special equipment includes damped drivers and receivers with filters. This special equipment adds cost and size to the testing system. Even utilizing such special equipment, digital shorts testing has not achieved satisfactory results.

What is needed is a system and method for performing low powered interconnect tests with increased throughput for test signals in an automatic test environment without requiring specialized equipment, while maintaining the accuracy associated with traditional analog test systems.

SUMMARY OF THE INVENTION

The present invention is a system and method for performing interconnect testing on a circuit board containing a plurality of pins or nodes. The circuit board testing system has a testhead containing a plurality of test channels, each test channel is configured for coupling with one of the nodes. The circuit board testing system includes a driving means, a receiving means, a switch means and a controlling means for controlling the driving means. The driving means produces a digital signal having a predetermined value. The driving means is calibrated to minimize signal error. The receiving means receives a signal from the driving means and trips high or low at a predetermined value. The receiving means is also calibrated to minimize signal error. Each testing means has a switch means. The switch means can couple a node to ground, or zero potential.

The method of the invention is for testing the interconnection of a plurality of nodes on a circuit board utilizing an automated test system having a plurality of testing channels. Each testing channel includes a digital driver, a digital receiver, a ground switch, and a test probe configured to contact one of the. plurality of nodes on the circuit board. The present invention calibrates each digital driver to precisely output a first predetermined signal voltage then calibrates each digital receiver to trip at a second predetermined signal voltage. After calibrations the present invention performs an interconnect test on the circuit board. The interconnect test comprises selecting a test group of nodes and identifying the classification of the test group from a node classification library. Based upon this classification one of three tests are performed on the test group. The three tests are: (1) a grounded test, to test if a node is shorted to ground or zero potential; (2) a connection test, to test if all nodes in said test group are connected together; and (3) an isolation test, to test if a node is isolated from all other nodes.

An advantage of the present invention is an increased signal throughput during interconnect testing.

BRIEF DESCRIPTION OF THE DRAWINGS

The foregoing and other objects, features and advantages of the invention will be apparent from the following more particular description of the preferred embodiments of the invention, as illustrated in the accompanying drawings, wherein.

DETAILED DESCRIPTION OF THE PREFERRED EMBODIMENT

The system and method of the pre-sent invention involve circuit board testing. Specifically the present invention detects open circuits, short circuits and connected nodes on printed circuit boards. Testing for all of these conditions is generally termed "shorts" testing.

The present invention employs a system that can perform either analog shorts or digital shorts testing of a circuit board. Analog shorts testing is performed using traditional, analog drivers and receivers. Digital testing is performed by employing off-the-shelf digital receivers and discrete digital drivers built with off-the-shelf components. The present invention combines the two testing systems into one system which may be used during either functional testing or in-circuit testing. The optimal use of the present invention occurs when the circuit boards being tested provide access to most nodes via their external pins.

Figure 1:
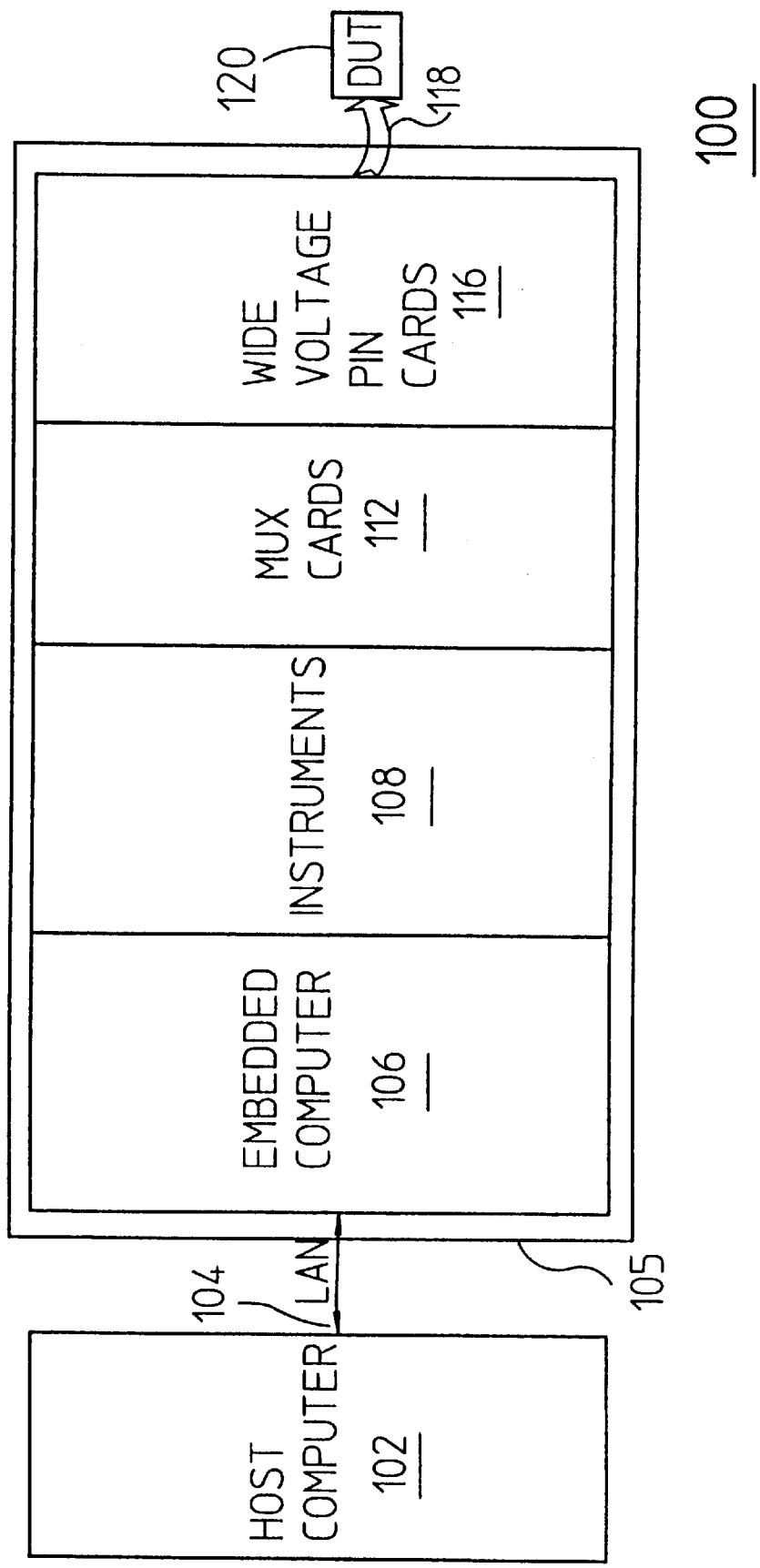
FIG. 1 is an illustration of a system incorporating the present invention.

FIG. 1 illustrates an environment in which the preferred embodiment can operate. A host computer 102 runs an application program. In the preferred embodiment, host computer 102 is a 486 series personal computer. The host computer 102 can be coupled to a testhead 105. The testhead comprises an embedded computer 106 which controls a plurality of instruments 108. The instruments are coupled to multiplexor (MUX) cards 112 which are, in turn, connected to the wide voltage pin cards 116. The testhead is capable of coupling to a circuit board under test, hereafter referred to as the device under test (DUT) 120, via DUT cable 118.

A local area network (LAN) 104 can be used to couple the testhead 105 and the host computer 102. The testhead 105 consists of two or more interconnected VXI frames which enable two or more instruments 108 to communicate with each other. The instruments may include analog devices, such as analog drivers and receivers, which can be used to perform analog testing on the DUT. An application program in the host computer 102 communicates with an interpreter which performs dynamic link library (DLL) calls which instruct remote testhead 105 to perform a particular function. In the preferred embodiment the testhead contains a 486 based personal computer as the embedded computer 106, which runs a real-time operating system. The testhead 105 generates a test signal which it outputs to the DUT.

The embedded computer 106 receives the instructions from the host computer 102. If analog testing is to be performed, the embedded computer 106 instructs the instruments and the MUX cards to perform a test on a DUT. If digital testing is to be performed, the embedded computer 106 instructs the wide voltage pin cards 116 to perform the test. The embedded computer 106 manipulates test channel 212, discussed below with reference to FIG. 2, directly via control lines 218 when digital testing is performed on the DUT.

Figure 2:
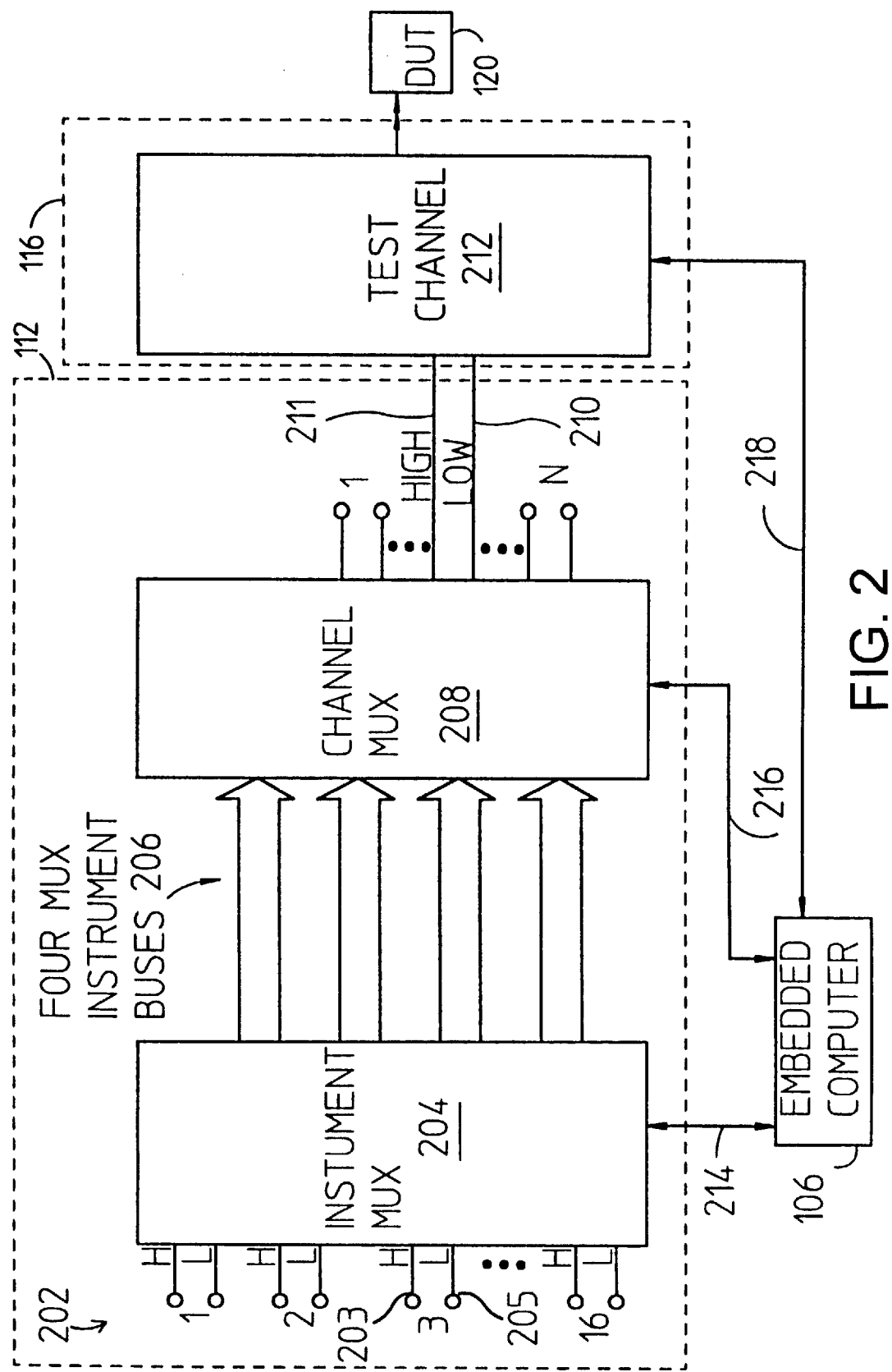
FIG. 2 is a more detailed illustration of the testhead of the present invention.

FIG. 2 illustrates the testhead 105 in greater detail. The MUX cards 204, 208 are generally utilized during analog testing of the DUT. In the preferred embodiment, sixteen instrument ports 202, each comprising a high line 203 and a low line 205, are input into an instrument MUX 204. The instrument MUX 204 outputs signals on four instrument buses 206. The embedded computer 106 instructs the instrument MUX 204 via control line 214 as to which instrument signals should be placed on the instrument buses 206. Instrument buses 206 are then multiplexed to a plurality of channels via channel MUX 208.

The Embedded computer 106 controls which signals are output from channel MUX 208 via control line 216. The channel MUX 208 outputs comprise DUT high lines 211 and DUT low lines 210. These high and low lines are generated by an instrument 108. The high and low lines are used as inputs into the test channel 212 during analog testing.

Figure 3:
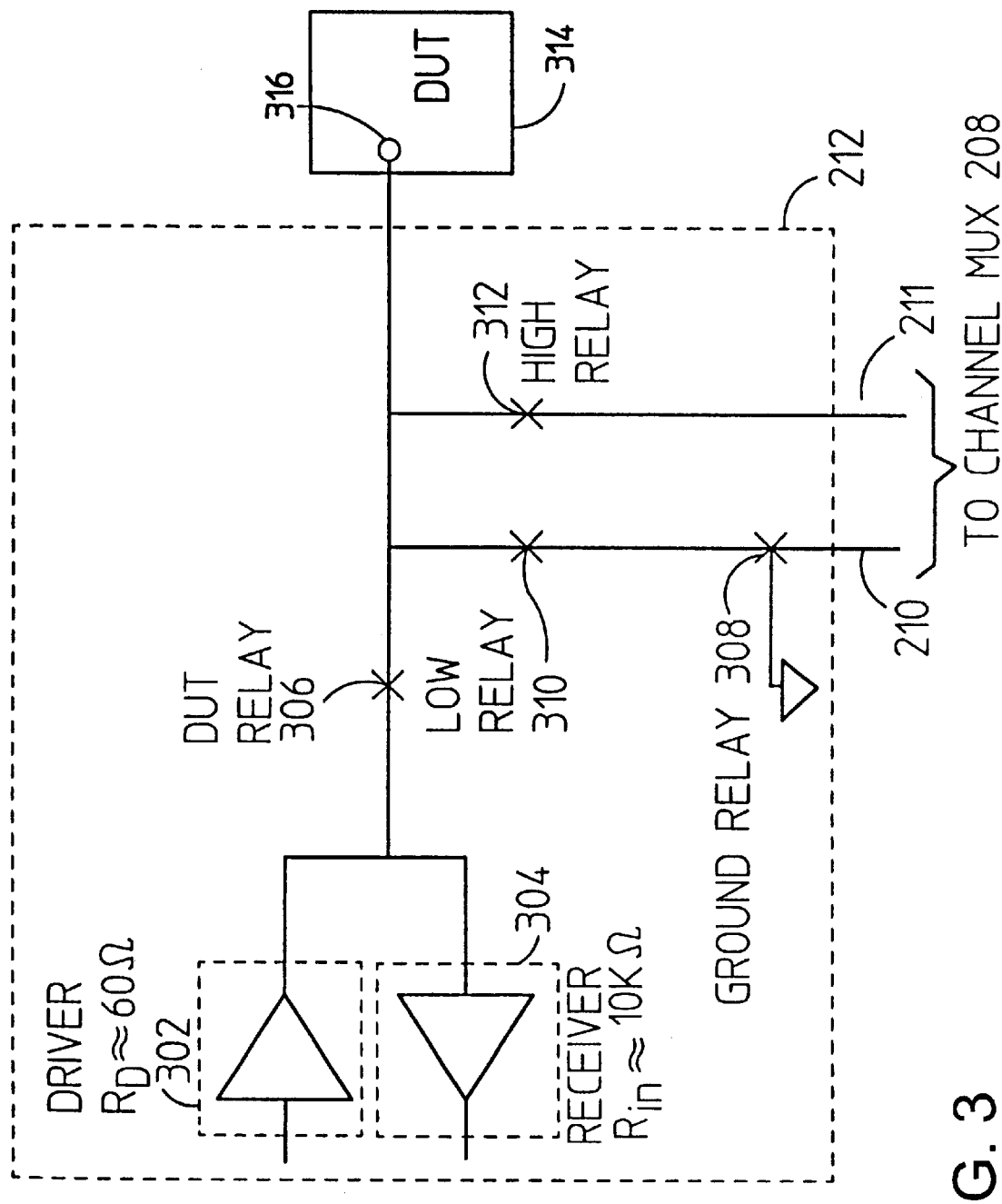
FIG. 3 is a detailed illustration of a test channel of the present invention.

Test channel 212 is shown in greater detail in FIG. 3. Typically, the number of channels is approximately 240 but can be several times larger or smaller with minor extensions to the architecture. When testing a particular circuit board, that is, a DUT, the number of channels utilized by the embedded computer 106 is generally equal to the number of nodes to be tested on the circuit board.

FIG. 3 illustrates the structure of each test channel 212 in greater detail. Many test channels 212 can exist in a remote testhead 105. In the preferred embodiment of the present invention each node to be tested on the printed circuit board has a test channel 212 associated with it. Each test channel 212 comprises a digital driver 302, a digital receiver 304 coupled to the output of the driver 302, a DUT relay 306 which can connect the output of the driver 302 and the input of the receiver 304 to a node 316 on the DUT, a ground relay 308 coupled between a node on the DUT and ground, a high relay 312 and a low relay 310 coupled respectively to the high and low lines of the channel MUX 208 and to a node on the DUT.

As explained above, unexpected short circuits can cause serious damage to a circuit board when the board is in a "powered up" state. To avoid component damage, shorts testing should be performed before a powered circuit board test occurs. The shorts test should apply a signal to the circuit board which is low enough to avoid turning on the semiconductor junctions. Limiting the driver voltage to approximately 200–250 millivolts (mV) enables shorts testing of the circuit board to be performed without turning on semiconductor junctions. The digital driver 302 is capable of generating such a precise voltage signal. In the preferred embodiment, the amplitude of this precise voltage signal is 200 mV with an edge rate of 1 Volt per nanosecond (V/ns).

The test channel operates in the following manner. If the DUT is to be tested utilizing analog signals, the embedded computer 106 opens the DUT relay 306 in order t o isolate the digital driver 302 from the DUT. This enables the analog instruments to place a signal on either the high line 211 or the low line 210 via the instrument MUX 204 and the channel MUX 208. Depending upon the signal on the high line 211 and the low line 210, the high relay 312 or the low relay 310 connects either the high line 211 low line 210 to a node on the DUT.

The preferred embodiment performs digital testing rather than analog testing. Digital testing is performed by having the embedded computer 106, in the testhead 105, cause the digital driver 302 to generate a test signal. When the test signal is to be sent to a node on the DUT, the embedded computer 106 closes the DUT relay. The embedded computer also opens the high relay 312 to ensure that no analog signals are sent to the nodes on the DUT. When a node on the DUT needs to be grounded, as the testing algorithm occasionally requires, the embedded computer grounds the node by closing the ground relay 308. In the preferred embodiment the low relay 310 must also be closed in order to ground the DUT. Alternative embodiments of the present invention do not require closing the low relay 310 in order to ground the DUT.

The digital driver 302 in the preferred embodiment of the present invention can be modelled as a voltage source with two high speed analog switches. The preferred embodiment of the present invention uses a Harris switch, model no. H1201HS, which is a high speed quad single pole, single throw CMOS analog switch. In the preferred embodiment, the digital driver 302 has an output impedance of approximately 60 Ω. The digital driver 302 should have a non-zero output impedance to establish a voltage divider between the output impedance and the not-to-ground impedance being tested on the DUT. In the preferred embodiment the output impedance is made up of the on-impedance of the switch and a series resistor. The receiver 304 is located in parallel with the node, from the perspective of the driver 302. Therefore, the receiver. is in a position to measure the node voltage after the voltage drops across the driver's output impedance.

The purpose of the receiver 304 is to receive a voltage signal that is output from the driver. The input voltage to the receiver is the voltage generated by the driver 302 reduced by the voltage drop across the output impedance of the driver. This is the equivalent of the voltage between the node and ground. The receiver 304 should have a high input impedance in order to minimize the amount of current drawn by the receiver. A shorts threshold resistance $R_S$ is defined such that if the impedance through the node is less than this threshold impedance the node is classified as being a short circuit. A typical value for the shorts threshold impedance, $R_S$, is 20 Ω. A threshold voltage is set in the receiver $V_{TH}$. This represents the voltage that will be present at the receiver input if the node impedance is equal to the shorts threshold impedance $R_S$. $V_{TH}$ is calculated using the formula shown in equation (1).

$$V_{TH} = V_{DH}\left[\frac{R_S}{R_S + R_D}\right] \quad (1)$$

In the preferred embodiment $V_{DH}$ is equal to 200 mV, $R_S$ is equal to 20 Ω, and $R_D$ is equal to 60 Ω. Therefore, using equation (1), $V_{TH}$ is equal to 50 mV. What this means is that, if during testing the receiver input voltage is less than $V_{TH}$, or 50 mV, then the node is considered to be shorted to ground.

As shown in FIG. 3, the output of the digital driver 302 and input to the digital receiver 304 are both coupled to a DUT relay 306. The DUT relay 306 provides a means for selectively connecting the driver 302 and receiver 304 to a node on the DUT 314. In an alternative embodiment, a tri-state driver can replace driver 302. By eliminating driver 302, the DUT relay is no longer necessary. Setting a tri-state driver to the open circuit state corresponds to opening the DUT relay.

The following is an example of how the test channel 212 operates. A node is chosen to be tested. The test will determine if the node is shorted to ground. The high relay 312 is opened in order to ensure that no analog signals are sent to the node. The embedded computer 106 instructs the DUT relay 306 to close. This connects the digital driver 302 and the digital receiver 304 to a node on the DUT. The embedded computer 106 then instructs the digital driver 302 to generate a short circuit test signal. In the preferred embodiment, this entails generating a low voltage signal $V_{DL}$, then generating a high voltage'signal $V_{DH}$. After a settling time passes the receiver measures the voltage on its input. If the node is shorted to ground, that is, if the impedance between the receiver input and ground is less than a threshold impedance $R_S$, the voltage at the receiver should be below a threshold voltage $V_{TH}$. This occurs because most of the voltage will drop across the digital driver's output impedance if the output is connected to ground. If the node on the DUT is not shorted to ground, the voltage drop across the output impedance of the digital driver will not be large enough to cause the digital receiver 304 to trip low, indicating that the node is not shorted to ground.

In order to maximize the accuracy of the present invention, the hysteresis value of the digital receiver 304 should be minimized (preferably to zero) for shorts testing. The digital driver 302 has a fast edge rate which can cause the receiver input voltage to overshoot $V_{TH}$. The hysteresis of the system becomes important when this overshooting occurs. When testing, if the node is not shorted to ground, the voltage at the receiver input will be greater than $V_{TH}$. A typical receiver hysteresis value is 75 mV. Therefore, in order for the receiver to recognize that a short circuit exists once the receiver has tripped to the high state, a voltage of −25 mv (50 mV−75 mV) must be present at the receiver in order to compensate for the 75 mV hysteresis. A short circuit would optimally produce a voltage of zero, if the impedance between the nodes is 0 Ω. Even an ideal (theoretical) short will not produce a receiver voltage low enough to overcome a 75 mV hysteresis. Therefore, the hysteresis must be minimized in order to reduce receiver errors.

The preferred embodiment utilizes a receiver with a programmable hysteresis. When testing for short circuits, the hysteresis is set to zero. Ile preferred embodiment of the present invention utilizes an ELANTEC Dual 50 MHZ receiver, model no. EL2252CM as the receiver 304. This is a standard, off-the-shelf, pin receiver utilize d for many types of integrated chip and circuit board testing. This receiver 304 has a hysteresis control input. The hysteresis is set to zero by grounding the hysteresis control input line of the receiver through one of the four high speed analog switches used in the driver 302.

The driver 302 and receiver 304 must both be precisely calibrated in order for the present invention to operate accurately. This calibration is necessary because the present invention utilizes low signal voltages. These low voltages must be precisely generated by the driver for several reasons, including: (1) to ensure that the semiconductor junctions on the circuit board are not turned on; and (2) the receiver 304 must measure the voltage at it's input which is dependent upon the driver voltage, therefore any signal error by the driver 302 will affect the accuracy of the receiver 304. The receiver 304 must be precisely calibrated in order to ensure that it trips at precisely $V_{TH}$. The receiver measures small amplitude signal voltages, therefore even a small voltage calibration error can be a significant percentage error of $V_{TH}$. The technique utilized in the present invention to calibrate the driver 302 and the receiver 304, is discussed below.

For the HPFTS40 functional test system, Hewlett Packard has a standard calibration method. This standard calibration method adjusts the driver and receiver to compensate for errors over the entire range of operating voltages. That is, for voltages encountered during both short circuit testing and full voltage circuit board testing. Driver calibration is achieved by setting the driver's output voltage to what should be 12 volts (V) and then to −12V. A gain and offset are calculated from the measured voltages. The driver has a linear operation throughout this voltage range so the calibration is a straightforward calculation.

Calibrating the receiver in the preferred embodiment is achieved by applying a DC voltage source to the receiver. The receiver's hysteresis need not be set to zero before calibration. To calibrate the reference-high voltage of the receiver $V_{TH}$, the input voltage is driven low, below the range of hysteresis, to ensure a "receiver low" state. The voltage is then progressively raised, to determine the voltage at which the receiver trips. A gain and offset are then calculated.

To calibrate the reference-low voltage of the receiver the opposite technique is performed. That is, the receiver is driven high, outside the range of hysteresis. The voltage is then progressively lowered until the receiver trips. The gain and offset are then calculated. This calibration is accurate even when the hysteresis is set to zero since the hysteresis is accounted for by driving low before testing the reference-high voltage and driving high before testing the reference-low voltage. The gain and offset values are used to program the receiver's trip point or threshold voltage to $V_{TH}$.

Noise on the signal lines can also be a problem to the receiver 304. The receiver 304 is therefore located in close proximity to the driver 302 to minimize noise at the receiver's input.

The architecture of the present invention, specifically coupling each node to a test channel, has the advantages of enabling all of the test channels to be independently programmable with respect to voltage input and hysteresis. This enables testing flexibility. For example, a test engineer may decide not to perform a shorts test on certain nodes. Instead, the test engineer may decide to bias these nodes or perform other tests simultaneously, if the circuit board design enables simultaneous testing to be accurately performed.

Figure 4:
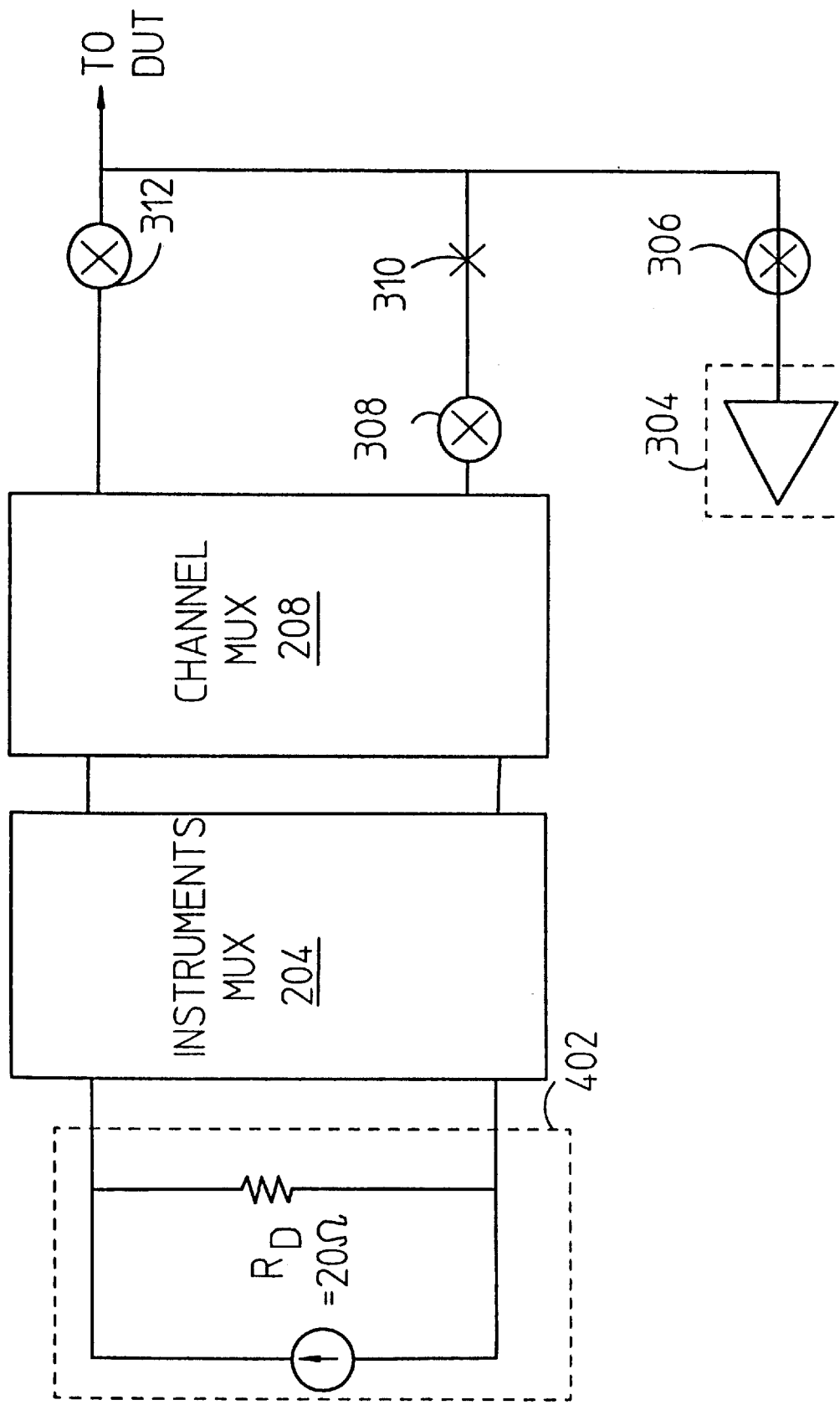
FIG. 4 is a detailed illustration of the testhead when a current digital-to-analog converter is used as the driver in the present invention.

FIG. 4 illustrates an example of the environment of the present invention if a DAC 402 is used instead of a driver 302. The DAC does not physically replace the driver 302, rather the DAC is located in the instrument area 108 of the testhead 105. The DAC 402 acts as a current source in parallel with an impedance, e.g. shunt impedance. In the preferred embodiment, the output impedance is 20 Ω. This impedance is chosen because it is equal to the typical short circuit threshold impedance chosen for this invention to minimize errors. This impedance can exist through shunting or a resistor may be added in series to the DAC output. The shorts threshold may be modified by changing $V_{TH}$, see equation (1) above. The high and low output signals of the DAC 402 are coupled to the instrument MUX 204. As described in FIG. 2, the outputs of instrument MUX 204 are input into channel MUX 208. The output of channel MUX 208 are sent through the high relay 312 to the DUT and to the ground relay 308 which when closed is a ground reference for the DAC. A ground relay 308 may also be coupled to the low output of the channel MUX 208 to provide a ground which is closer to the DUT than signal grounded adjacent to the DAC. As is the situation is FIG. 3, a receiver 304 is coupled to a node on the DUT via a DUT relay 312.

Figure 5:
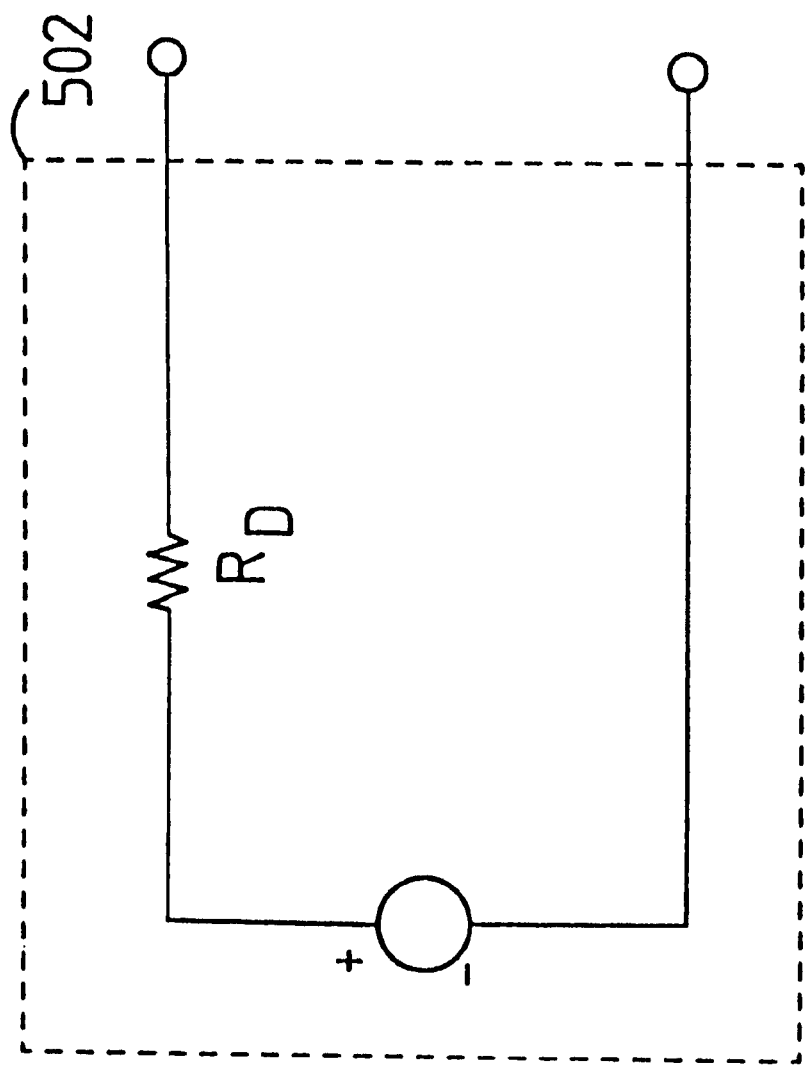
FIG. 5 is an illustration of a Thevenin equivalent voltage source used as the driver in the present invention.

FIG. 5 illustrates that the Thevenin equivalent circuit 502 of the DAC 402 can also be used, i.e., a voltage source in series with a resistor. In both FIG. 4 and FIG. 5 the ground connection can occur at either the instrument, 402 or 502, or by using the instrument MUX 204, the channel MUX 208 and the ground relay 308.

FIGS. 6A–F illustrate the testing method 600 of the present invention. Threshold values are set before the procedure detailed in FIG. 6 begins. These values are based upon the hardware shown in FIG. 3. The driver 302 has the ability to "drive high" and "drive low". This enables shorts, opens and interconnect testing of the nodes. In the preferred embodiment the drive high voltage, $V_{DH}$ of the driver is 200 mV. This value may be altered slightly, but as discussed earlier, care must be taken to ensure that the semiconductor junctions of the components on the circuit board are not turned on by the drive high voltage when the DUT relay 306 is closed. The drive low voltage, $V_{DL}$ is set at ($V_{TH}$−1.0V). $V_{TH}$ is a threshold voltage and is determined by the formula shown in equation (1). As discussed above, in equation (1), $V_{TH}$ is compared to the receiver voltage in order to determine if the node is shorted to ground or is shorted to another node. In equation (1), $R_S$ is a short circuit threshold impedance. The impedance between a node and ground or between interconnected nodes need not be 0 Ω in order to be considered a short circuit. In the present invention, $R_S$ is typically set to 20 Ω. This means that if the impedance between a node and ground or between two nodes is less than 20 Ω it is considered to be a short circuit. $R_D$ is the output impedance of the driver 302.

Figure 6A:
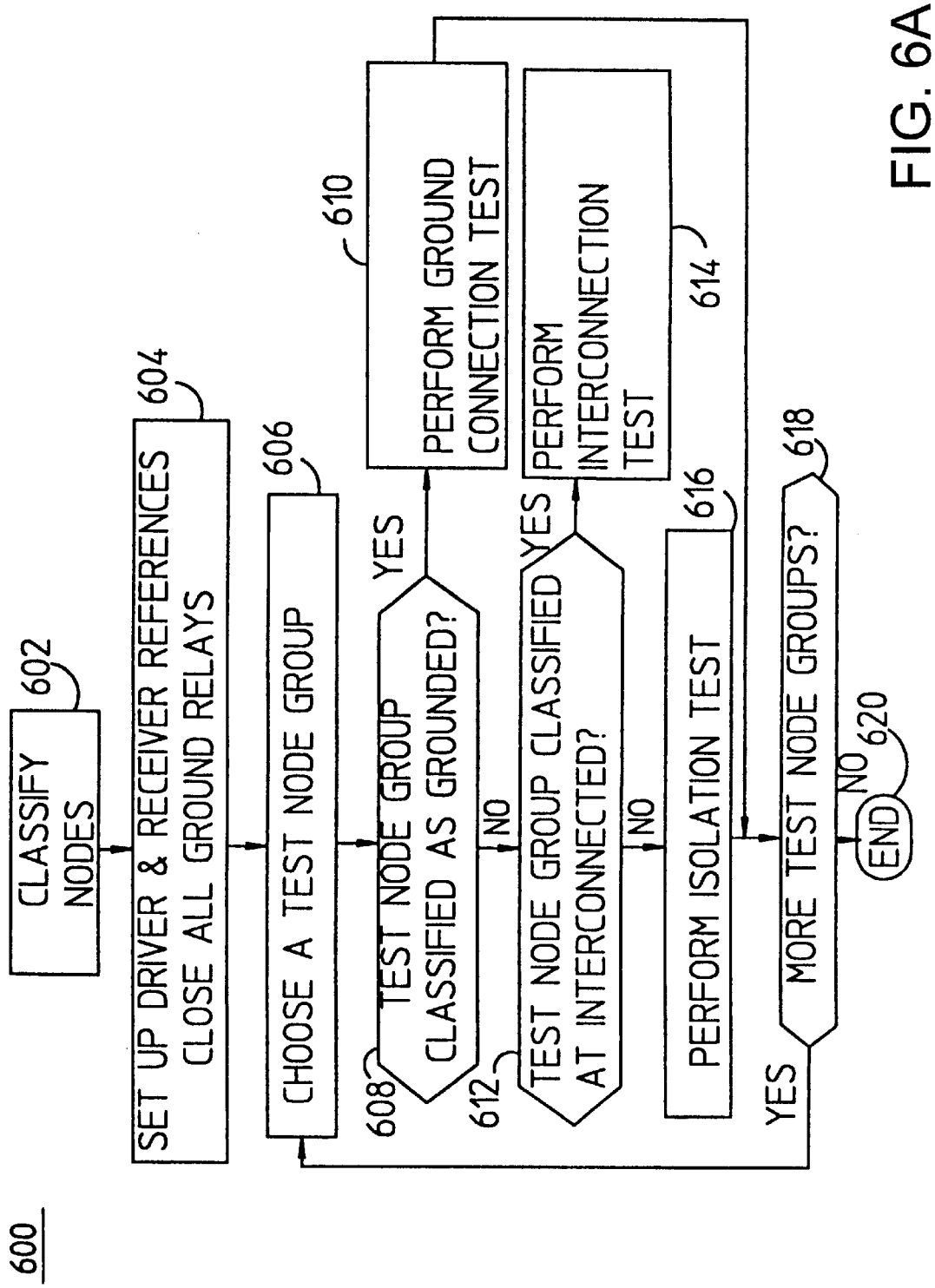
FIGS. 6A–F are flow diagrams of the test method of the present invention.

As shown in FIG. 6A, all of the nodes on a circuit board are classified in step 602. The classification can be input by a user, determined by the computer given the CAD/CAM design database of the circuit board or learned by the automatic tester through a learning algorithm. The classification is based upon the circuit board design and involves grouping all nodes on a circuit board into one of three classifications. The node classifications are stored in a node classification library or a pin classification library in the host computer 102 or another convenient memory location.

The first classification is that the node or group of nodes are shorted to ground. The requirement for this classification is that a given node's impedance to ground must be less than the predefined threshold impedance $R_S$. In the preferred embodiment, this threshold impedance is typically 20 Ω. The second classification is that a group of nodes are interconnected to each other. The requirement for this classification is that all nodes in a group must be shorted to each other and not to ground. As before, the impedance between nodes need not be 0 Ω, rather it must merely be less than a predefined threshold impedance, which in the present invention is typically set to 20 Ω. The third classification is that a particular node is isolated. Node isolation requires that the node not be shorted to any other node or to ground. All nodes will fit into one of the three classifications. However, it is possible to have a situation where a node or group of nodes may be in more than one classification. Step 602 is performed before the driver 302 applies voltage to any node.

Figure 6B:
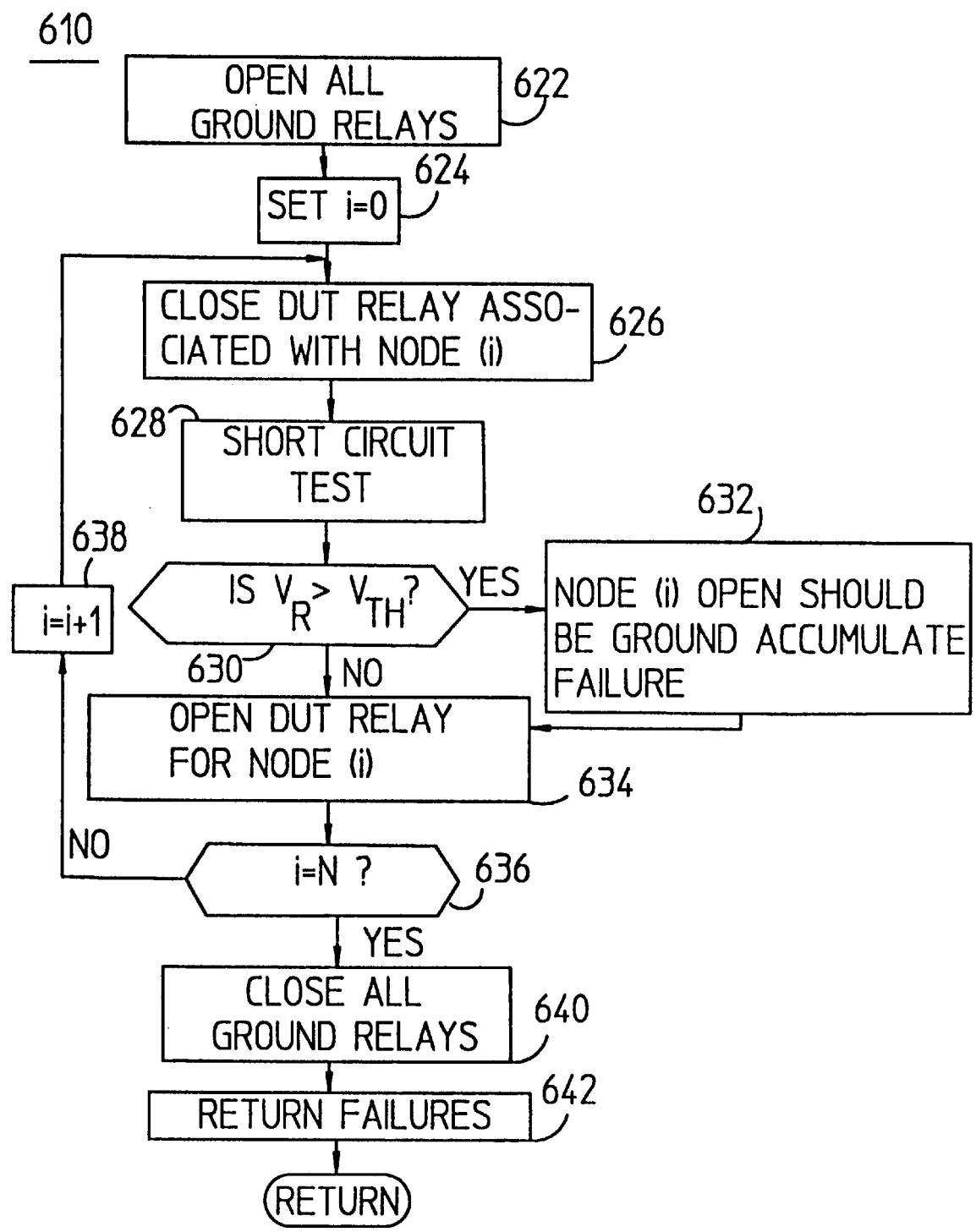
Figure 6C:
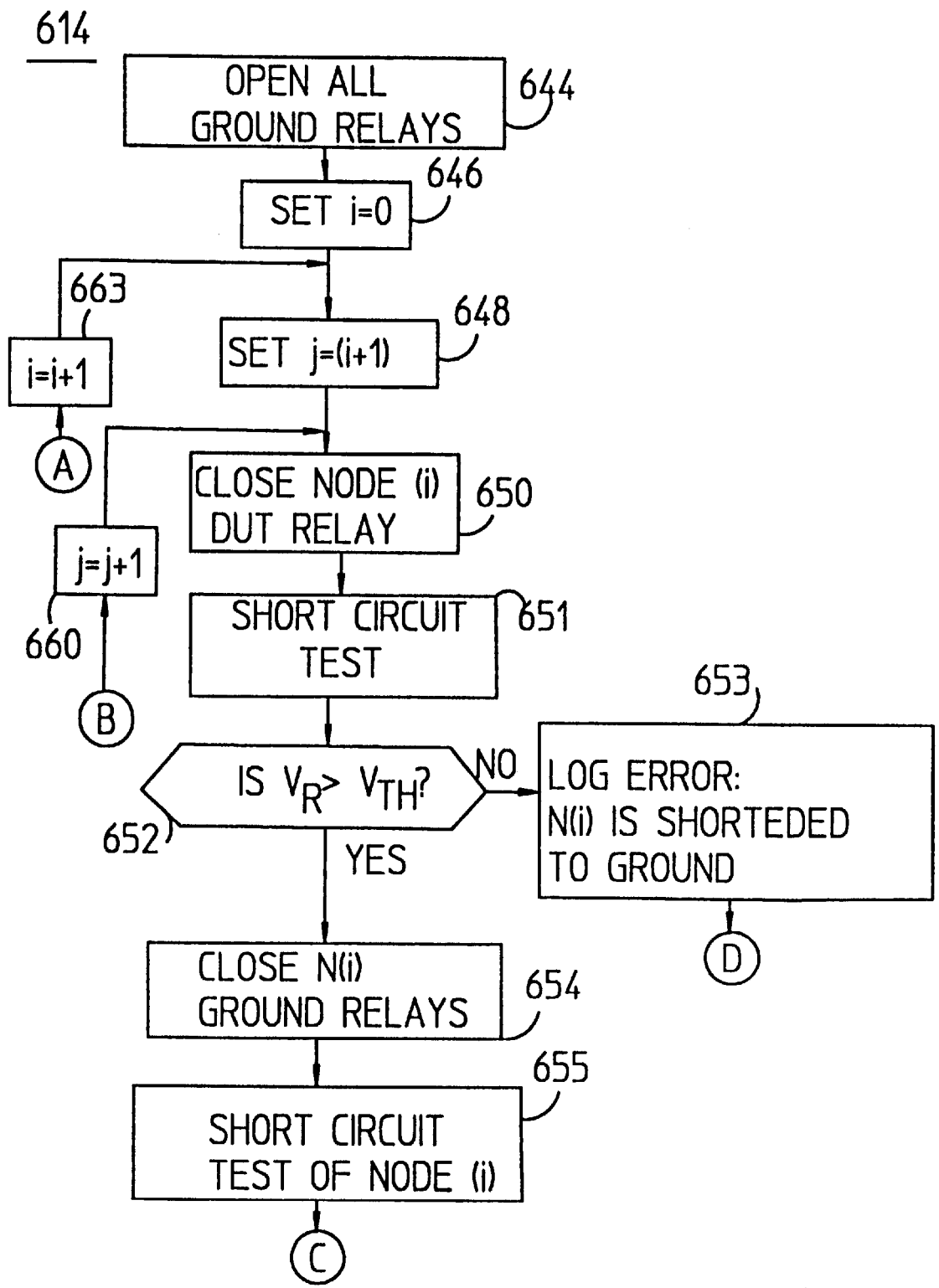
Figure 6D:
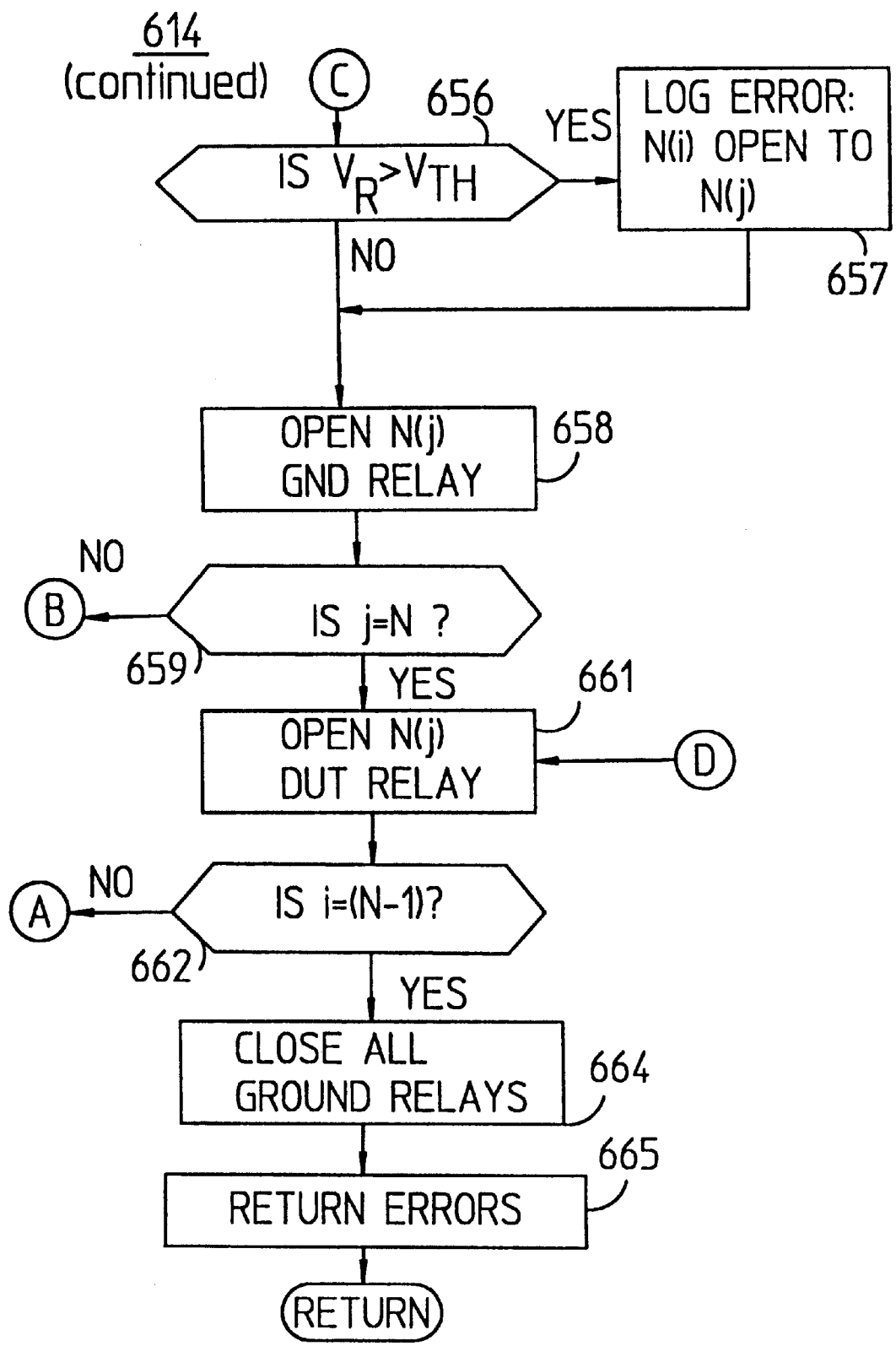
Figure 6E:
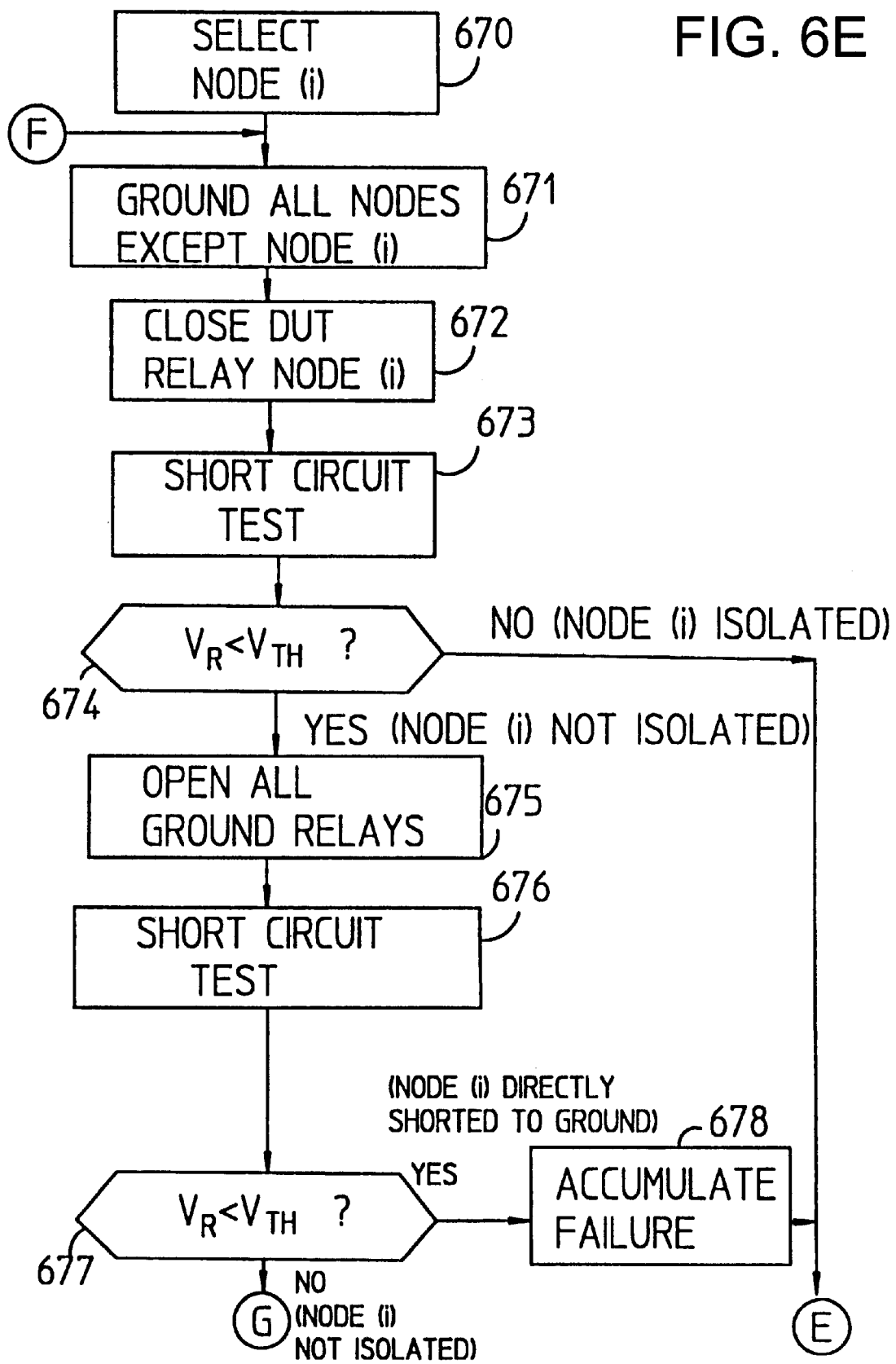
Figure 6F:
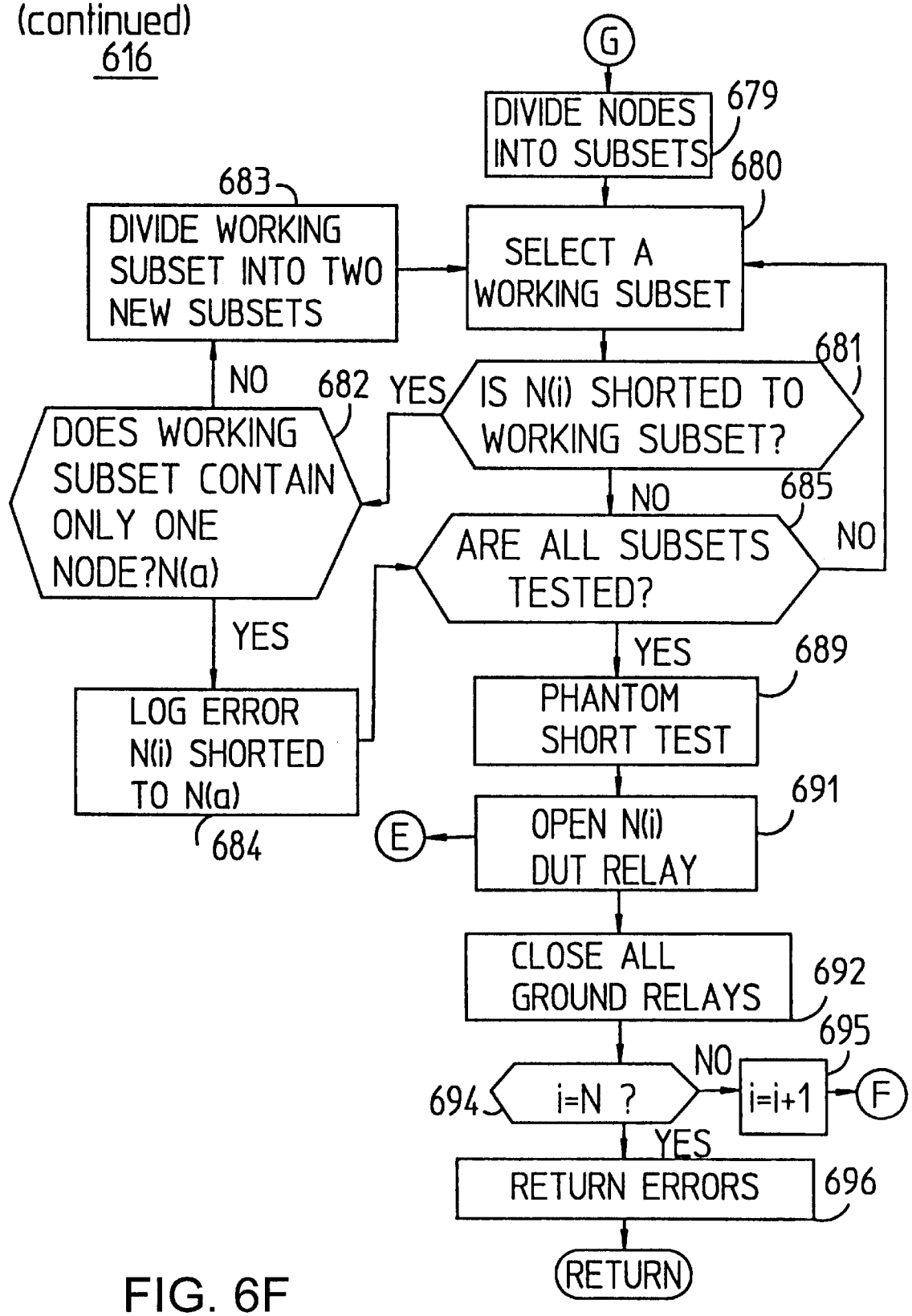

Initialization step 604 sets up the driver 302 and the receiver 304. In addition, all ground relays 308 and low relays 310 are closed. Closing all ground relays 308 and low relays 310 has the effect of connecting all of the nodes to ground. In step 606, a group of nodes which have been classified together in step 602 are selected as a test group. If, at step 608, the test group is classified as being shorted to ground, the test group will be tested in step 610 to determine if such a classification is physically accurate. Step 610 is illustrated in FIG. 6B and is described in detail below. If, at step 612, the test group is classified as being connected to each other, the test group will be tested in step 614 to determine if such a classification is physically accurate. Step 614 is illustrated in FIG. 6C and FIG. 6D and is described in detail below. If the test group is classified as being isolated, then the test group will be tested in step 616 to determine if such a classification is physically accurate in step 616. Step 616 is illustrated in FIG. 6E and FIG. 6F and is described in detail below. After the appropriate test is completed for all nodes in a test group, another test group is selected in step 606 until no more test groups remain, as determined by step 618. When all test groups have been tested, the test ends at step 620.

The test 610 for determining whether all nodes in a test group are tied, that is, shorted, to ground is described in greater detail in FIG. 6B. In the preferred embodiment, program control is transferred from the host computer 102 to an embedded personal computer 106 in a remote testhead 105 of FIG. 1. In step 622, the ground relays to all nodes, even those nodes not in, the test group, are opened.

Steps 626–634 are then performed for each node in the test group. Any technique which ensures that each node in the test group is individually tested can be used. In the preferred embodiment, a counter (i) is used. If (N+1) nodes are present in the test group then the counter (i) is set equal to zero at step 624 and incremented at step 638 as each node is tested. The DUT relay 306 is closed for the selected node, i.e., node(i), in step 626.

A short circuit test is then performed in step 628. In the preferred embodiment of the present invention, the short circuit test entails driving node(i) low, then driving node(i) high. The node voltage is allowed to settle before being read by the receiver. The settling time depends upon the impedance-capacitance time constant (RC) of node(i). The receiver voltage, $V_R$, is compared to the predetermined threshold voltage, $V_{TH}$, in step 630. If $V_R$ is greater than $V_{TH}$, the node(i) is not shorted to ground. Therefore, the test fails for this node, and an error indication can either be returned immediately, or the error can be accumulated and returned at the completion of the test as indicated in step 632. The DUT relay 306 is opened for node(i) in step 634, and if more nodes exist, as determined by step 636, another node is selected and (i) is incremented in step 638.

After testing all nodes, the preferred embodiment closes the ground relays 308 to all nodes in step 340 to leave the system in the same state as when the test routine was called. If any errors are accumulated in step 632, they are then returned in step 642. Control is then returned to the host computer 102 to select another test group as indicated in step 618.

The test 614 for determining whether all nodes in a test group are interconnected is shown in greater detail in FIG. 6C and FIG. 6D. In step 644, the ground relays to all nodes are opened. In the preferred embodiment, program control is transferred from the host computer 102 to an embedded personal computer 106 in the remote testhead 105 of FIG. 1. There are (N+1) nodes in the test group. In steps 646 and 648, a primary node and a secondary node are selected from the test group. These two steps also set two counters "i" and "j" to ensure that each node in the test group is eventually chosen and can be tested in steps 650–662 against every other node in the test group. Any technique to accomplish the same result may be substituted without losing accuracy.

In step 650, the DUT relay 306 for node(i), the primary node, is closed. A short circuit test is then performed in step 651. The test utilized in the preferred embodiment has been previously detailed above in step 628. If $V_R$ is less than VYnl, as determined in step 652, then node(i) is shorted to ground. An error indication is given in step 653. A new primary node is then chosen and (i) is incremented in step 663. If $V_R$ is not less than $V_{TH}$, as determined in step 652, the ground relay 308 for nodes) is closed at step 654. A short circuit test is then performed on node(i) in step 655. If $V_R$ is greater than $V_{TH}$, as determined in step 656, then node(i) is not shorted to node(j). An error indication can either be returned immediately or the error can be accumulated and returned at the completion of the test, as indicated in step 657.

The ground relay 308 for node(j) is opened in step 658. Step 659 determines if there are any secondary nodes left to be tested against the primary node. If there are more secondary nodes, step 660 chooses one and increments counter (j). Steps 650–659 are then repeated until no secondary nodes remain for the selected primary node. When no secondary nodes remain for the selected primary node, the DUT relay 306 is opened for node(i) at step 661. Step 662 determines if any nodes remain in the test group that have not been tested with every other node in the test group. If such nodes exist, one is chosen in step 663 to be a primary node and steps 648–662 are repeated until no such nodes remain. When no primary nodes remain, the ground relays 308 for all nodes are closed in step 664 and any unreturned errors are returned as indicated by step 665. Thereafter, control is returned to the host computer 102 to select another test group as indicated in step 618.

The test for determining whether all nodes in a test group are isolated from all other nodes, even those outside the test group 616, is described in greater detail in FIG. 6E and FIG. 6F. In the preferred embodiment, program control is transferred from the host computer 102 to an embedded personal computer 106 in the remote testhead 105 of FIG. 1. There are (N+1) nodes in the test group. One node, node(i), is selected in step 670. The ground relay 308 for node(i) is opened in step 671. All other ground relays remain closed. In step 672, the DUT relay 306 for node(i) is closed. All other DUT relays remain open. A short circuit test is performed in step 673. The short circuit test employed in the preferred embodiment is described in detail in step 628.

Node(i) is isolated if the receiver voltage is larger than the threshold voltage. If node(i) is isolated, as determined by step 674, then the system resets the relays in the test channel associated with node(i). Resetting is achieved by opening the test channel's DUT relay 306 and closing the test channel's ground relay 308, in steps 691–692. After resetting the relays, another node is chosen from the test group and (i) is incremented in step 695, if more nodes remain untested as determined in step 694.

If the receiver voltage is less than the threshold voltage as determined by step 674, then the node is not isolated from ground. To determine whether the short to ground is through another node, all ground relays are opened in step 675, and a short circuit test is performed in step 676. If the receiver voltage is less than the threshold voltage as determined in step 677, then node(i) is shorted to ground, and such an error indication is reported or logged in step 678. After completing step 678, the DUT relay is opened in the test channel associated with node(i) in step 691, the ground relays for all nodes are closed in step 692, and another node is chosen in step 695, if more nodes remain in the test group as determined in step 694.

If the testhead determines in step 677 that the receiver voltage is larger than the threshold voltage then at least one node is shorted to node(i). A procedure for isolating the problem node is set forth in steps 679–685. Dividing all nodes, except node(i), into two subsets occurs in step 679. From these subsets a working subset is chosen in step 680. The testhead determines ill step 681 whether node(i) is shorted to tile working subset. Step 681 comprises closing die ground relay for all nodes in tile working subset, opening the ground relays 308 for all nodes not in the subset and performing a short circuit test on nlode(i). If the receiver voltage is less than die threshold voltage then node(i) is shorted to the working subset. The working subset is then itself divided into two new subsets in step 683, unless the working subset contains only one node (determined in step 682). These two new subsets are characterized as being one level below the level of the initial subsets, that is, their parents. One of the new subsets is then chosen as the working subset in step 680. The testhead then determines in step 681 whether node(i) is shorted to the new working subset. If node(i) is shorted to the working subset then the working set again divides and is tested against node(i) for shorts until the working subset contains only one node as determined by step 682. At this point, the sole node in die working group is known to be shorted to node(i). An error indication to this affect is given in step 684.

If not all subsets have been tested as determined in step 685, the subset at the lowest level is then chosen as the working subset in step 680 and tile process is repeated until all subsets have been checked. It is possible for both subsets at the same level to not be shorted to node(i) even though their "parent" subset is shorted to node(i). This situation is known as a phantom short. In the preferred embodiment of the present invention, phantom shorts are not reported. However, a test for isolating phantom shorts may be achieved using a process similar to the subset dividing method of steps 679–685. Such a phantom isolation test could occur at step 689, that is, after it is determined in step 685 that all subsets have been tested. Any other search or chiop algorithm may be substituted for the described binary chiop algorithm.

After all subsets are tested, all ground relays are closed and tile DUT relay for node(i) is opened in steps 691–692. Steps 671–692 are repeated for all nodes in the test group. After all nodes in the test group are tested as determined in step 694, all errors are returned to the host computer 102, if they have not already been returned. Control is then returned to the host computer 102 to select another test group as indicated in step 618. The test is complete as indicated in step 620 when all test groups have been selected and tested.

While the invention has been particularly shown and described with reference to a preferred embodiment thereof, it will be understood by those skilled in the art that various changes in form and details may be made therein without departing from the spirit and scope of the invention.

What is claimed is:

1. A method for testing node interconnection on a circuit board having a plurality of nodes using an automated test system comprising at least one test channel, each of the at least one test channel comprising a digital driver having a first input and a first output, a digital receiver having a second output and a second input, the second input being coupled to the first output, and a test probe, the test probe being coupled to the first output and the second input, and the test probe being configured to couple the first output and second input to one of the plurality of nodes, the method comprising:

(a) said digital driver of a first test channel applying a test signal to a selected node of the plurality of nodes;

(b) a predetermined amount of time after said application of said test signal, said digital receiver of the first test channel reading a node voltage of said selected node;

(c) comparing said node voltage to a predetermined threshold voltage of said digital receiver of the first test channel; and (d) indicating whether said selected node is coupled to ground based on said comparison of said node voltage to said threshold voltage.

2. A method as in claim 1, wherein said test signal applied by said digital driver of the first test channel is a low powered digital signal which is incapable of activating semiconductor junctions located on the circuit board.

3. A method as in claim 1, further comprising calibrating said digital driver of the first test channel so that said test signal has a voltage sufficiently low such that applying said test signal to the circuit board does not activate semiconductor junctions located on the circuit board.

4. A method as in claim 1, wherein:

(a) the first output of the first test channel comprises an incline impedance having a known value; and (b) said known value contributes in determining said predetermined threshold voltage.

5. A method as in claim 1, wherein said predetermined amount of time is a function of an impedance-capacitance time constant of said selected node.

6. A method as in claim 1, further comprising, prior to application of said test signal, coupling a second node of the plurality of nodes on said circuit board to ground.

7. A method as in claim 6, wherein said coupling of said second node to ground comprises:

(a) placing said test probe of a second test channel in contact with said second node; and (b) closing a number of switches of said second test channel to couple said second node to ground.

8. A method as in claim 1, further comprising, if said selected node is not coupled to ground:

(a) coupling a second node of the plurality of nodes on said circuit board to ground;

(b) applying a test signal to said selected node via said digital driver of the first test channel;

(c) a predetermined amount of time after said application of said test signal, reading a node voltage of said selected node via said digital receiver of the first test channel;

(d) comparing said node voltage of said selected node to said predetermined threshold voltage of said digital receiver of the first test channel; and (e) indicating whether said selected node is coupled to said second node based on said comparison of said node voltage of said selected node to said threshold voltage of said digital receiver of the first test channel.

9. A system as in claim 8, wherein said coupling of said second node to ground comprises:

(a) placing said test probe of a second test channel in contact with said second node; and (b) closing a number of switches of said second test channel to couple said second node to ground.

10. A method as in claim 1, wherein said selected node is a member of a group of nodes on said circuit board, the method further comprising, prior to application of said test signal, coupling all nodes in said group of nodes, but for said selected node, to ground so that said indication is an indication of whether said selected node is isolated from the remaining nodes of said group of nodes.

11. A method as in claim 10, wherein said coupling of a given node in said group of nodes to ground, comprises:
 (a) placing said test probe of a given test channel in contact with said given node; and
 (b) closing a number of switches of said given test channel to couple said second node to ground.

12. A method as in claim 10, further comprising, if said selected node is not isolated from said remaining nodes of said group of nodes:
 (a) releasing all nodes in said group of nodes from ground couplings which are not predetermined by the structure of said circuit board; and
 (b) determining if said selected node is directly coupled to ground.

13. A method as in claim 12, wherein determining if said selected node is directly coupled to ground comprises:
 (a) said digital driver of the first test channel applying a test signal to said selected node;
 (b) a predetermined amount of time after said application of said test signal, said digital receiver of the first test channel reading a node voltage of said selected node;
 (c) comparing said node voltage to said predetermined threshold voltage of said digital receiver of the first test channel; and
 (d) indicating whether said selected node is coupled to ground based on said comparison of said node voltage to said threshold voltage.

14. A method as in claim 12, further comprising, if said selected node is not isolated from said remaining nodes of said group of nodes, and said selected node is not directly coupled to ground, and it is not yet known which of said nodes in said group of nodes said selected node is connected to, coupling varying subsets of nodes in said group of nodes to ground, and for each subset of nodes so coupled:
 (a) applying a test signal to said selected node via said digital driver of the first test channel;
 (b) a predetermined amount of time after said application of said test signal, reading a node voltage of said selected node via said digital receiver of the first test channel;
 (c) comparing said node voltage to said predetermined threshold voltage of said digital receiver of the first test channel; and
 (d) indicating whether said selected node is isolated from said subset of nodes based on said comparison of said node voltage to said threshold voltage.

15. A method as in claim 14, wherein each of said varying subsets of nodes in said group of nodes comprises half of the nodes in a subset of nodes for which isolation from said selected node has already been determined.

16. A method as in claim 1, wherein said automated test system comprises a plurality of test channels.

17. A method as in claim 16, wherein each of said plurality of test channels comprises a number of switches coupled to a test channel's first output and second input, said number of switches being configured to selectively couple the first output and the second input of their test channel to ground.

18. A method as in claim 17, wherein said selected node is a member of a group of nodes on said circuit board, the method further comprising, if said selected node is not coupled to ground:
 (a) for each of said nodes in said group of nodes, placing a test probe of a different one of the plurality of test channels in contact with said node;
 (b) closing said number of switches of a second test channel to couple a second node of said group of nodes to ground;
 (c) applying a test signal to said selected node via said digital driver of the first test channel;
 (d) a predetermined amount of time after said application of said test signal, reading a node voltage of said selected node via said digital receiver of the first test channel;
 (e) comparing said node voltage to said predetermined threshold voltage of said digital receiver of the first test channel;
 indicating whether said selected node and said second node are coupled to one another based on said comparison of said node voltage to said threshold voltage; and
 (g) opening said number of switches of said second test channel and repeating steps (b)–(f) for said selected node, in combination with each other node in said group of nodes.

19. A method as in claim 17, wherein said selected node is a member of a group of nodes on said circuit board, the method further comprising, prior to application of said test signal:
 (a) for each of said nodes in said group of nodes, placing a test probe of a different one of the plurality of test channels in contact with said node;
 (b) closing said number of switches of each test channel connected to a node in said group of nodes, but for said number of switches of the first test channel, so as to couple each node in said group of nodes, but for said selected node, to ground so that said indication is an indication of whether said selected node is isolated from the remaining nodes of said group of nodes;
 (c) if said selected node is not isolated from said remaining nodes of said group of nodes,
  (i) opening said n umber of switches of each test channel connected to a node in said group of nodes; and
  (ii) determining if said selected node is directly coupled to ground;
 (d) if said selected node is not isolated from said remaining nodes of said group of nodes, and said selected node is not directly coupled to ground, and it is not yet known which of said nodes in said group of nodes said selected node is connected to, coupling varying subsets of nodes in said group of nodes to ground, and for each subset of nodes so coupled:
  (i) applying a test signal to said selected node via said digital driver of the first test channel;
  (ii) a predetermined amount of time after said application of said test signal, reading a node voltage of said selected node via said digital receiver of the first test channel;
  (iii) comparing said node voltage to said predetermined threshold voltage of said digital receiver of the first test channel; and
  (iv) indicating whether said selected node is isolated from said subset of nodes based on said comparison of said node voltage to said threshold voltage.

20. A method as in claim 19, wherein each of said varying subsets of nodes in said group of nodes comprises half of the nodes in a subset of nodes for which isolation from said selected node has already been determined.

* * * * *